United States Patent [19]

Kasowski et al.

[11] Patent Number: 5,409,801
[45] Date of Patent: Apr. 25, 1995

[54] ELECTRON BEAM LITHOGRAPHY

[75] Inventors: Robert V. Kasowski, West Chester, Pa.; Sau L. Tang, Hockessin, Del.

[73] Assignee: E. I. Du Pont de Nemours and Company, Wilmington, Del.

[21] Appl. No.: 228,171

[22] Filed: Apr. 15, 1994

Related U.S. Application Data

[63] Continuation of Ser. No. 10,214, Jan. 28, 1993, abandoned.

[51] Int. Cl.6 .................................................. G03F 7/00
[52] U.S. Cl. ..................................... 430/296; 430/273; 430/911; 430/909; 430/942; 250/492.3
[58] Field of Search ............... 430/273, 296, 911, 942, 430/909; 250/492.3

[56] References Cited

U.S. PATENT DOCUMENTS 5,139,922  8/1992  Watanabe et al. ................. 430/296

Primary Examiner—Janet C. Baxter

[57] ABSTRACT

A method for improving the resolution of an electron resist pattern on a substrate coated with a polymeric electron resist film is disclosed which provides an external coating layer of dried polymer selected from the group consisting of water-soluble polymers and poly(m-phenylene isophthalamide), or of a mixture consisting essentially of said dried polymer and hexavalent tungsten compounds wherein the weight ratio of the tungsten compounds to polymer is up to about 1:1. Also disclosed are substrates coated with a polymeric resist film wherein the resist film consists essentially of such external layers, or wherein an external coating layer of said polymer-tungsten compound mixture is provided.

21 Claims, No Drawings

ELECTRON BEAM LITHOGRAPHY

This is a continuation, of application Ser. No. 08/010,214, filed Jan. 28, 1993, now abandoned.

FIELD OF THE INVENTION

This invention relates to electron beam lithography and more particularly to pattern formation on substrates by using polymeric electron resist films.

BACKGROUND

The application of electron beam techniques to the fabrication of patterned substrates such as those used for microelectronic devices, has enabled a reduction in the pattern line widths for the device elements and also an increase in the pattern density. This has been accomplished mainly through perfection of the electron beam generating device (e.g, to increase the current density of the electron beam and/or to reduce the beam diameter) and through improving the materials used for defining the pattern on the substrate (i.e., resist materials).

In electron beam lithography, a substrate (e.g., silicon oxide, silicon, glass, quartz, or glass or quartz coated with a metal such as iron or chromium or the oxides, nitrides, and salts of these metals) is coated with polymer resist material. During patterning, the resist is exposed to a rastering or moving electron beam in sufficient dosage to change the solubility of the resist polymer to a particular solvent in the areas where the electron beam has interacted with the resist. To develop the electron-beam pattern, the solvent is used to dissolve away the parts of the resist that are soluble after exposure, while the parts that are not soluble after exposure remain on the substrate. The resulting pattern is used as a mask for forming a more permanent pattern on the substrate using a technique such as plating, chemical etching, ion-etching, ion-implantation, or photolithography.

As pattern density on these devices has increased, so has the need for methods to rapidly provide lithographic features with improved resolution. Proximity effects, which are due to electron forward scatter through the resist layer and backward scatter from the substrate, limit the line width and spacing of the lithographic features (see, e.g., T.H.P. Chang et al., Nanostructure Technology, IBM J. Res. Develop., Vol. 32, No. 4, pp. 462–492 (1988)). Reduction of proximity effects represents one means of improving resolution in electron beam lithography, thereby enabling the production of devices having higher pattern density.

SUMMARY OF THE INVENTION

This invention provides a method for improving the resolution of an electron resist pattern on a substrate coated with a polymeric electron resist film. The method is characterized by providing an external coating layer of dried polymer selected from the group consisting of water-soluble polymers (e.g., polyvinyl acetate, polyvinyl alcohol, polyvinyl pyrrolidone, and/or hydroxypropyl cellulose) and poly(m-phenylene isophthalamide) (e.g., Nomex ® available from E. I. du Pont de Nemours and Company), or of a mixture consisting essentially of said polymer and at least one hexavalent tungsten compound wherein the weight ratio of the tungsten compounds to polymer is up to about 1:1. The external coating layer may itself function as the polymeric electron resist or can serve as an additional coating applied to another dried essentially polymeric resist (e.g., polymethylmethacrylate). This invention also provides a substrate coated with a polymeric electron resist film characterized by said resist film consisting essentially of an external layer of dried polymer selected from the group consisting of water-soluble polymers and poly(m-phenylene isophthalamide), or a mixture consisting essentially of said polymer and at least one hexavalent tungsten compound wherein the weight ratio of the tungsten compounds to polymer is up to about 1:1; and a substrate coated with a polymeric electron resist film characterized by having an external coating layer of a mixture consisting essentially of dried polymer selected from the group consisting of water-soluble polymers and poly(m-phenylene isophthalamide) and at least one hexavalent tungsten compound, the weight ratio of the tungsten compound to polymer being between about 0.01:1 and about 1:1.

DETAILED DESCRIPTION

In accordance with this invention, polymers selected from the group consisting of water-soluble polymers and poly(m-phenylene isophthalamide) are used for providing improved resolution to electron beam pattern formation. These polymers may be applied directly to an underlying substrate such as chrome-coated quartz or silicon, or may be applied to a dried conventional resist material such as polymethyl-methacrylate. The dried polymer layer of this invention can be a water-soluble polymer such as polyvinyl alcohol (PVA), polyvinyl pyrrolidone (PVP), hydroxypropyl cellulose (HPC), polyvinyl acetate (PVAc), or water-insoluble polymers such as poly(m-phenylene isophthalamide) (MPD-I). In any case, the external coating layer of these polymers is dried for use in electron beam lithography. The layer thickness can be equal to, or less than any additional electron resist layer or layers. Typically, after drying the thickness of the external coating layer is from about 20 nanometers (nm) to about 600 nm. Preferably, the thickness is from about 50 nm to 400 nm.

No other layer needs to be applied below or above this polymer layer. Indeed in accordance with this invention the dried polymer layer of water-soluble polymer and/or MPD-I may be used as a high-resolution electron resist; and this invention provides substrates coated with an electron resist film consisting essentially of an external layer of said dried polymer. In other embodiments of this invention, a dried polymer layer of water-soluble polymer and/or MPD-I may be used in combination with additional essentially polymeric resist material(s). In these embodiments the dried polymer layer (e.g., a layer of PVA, PVP, HPC, PVAc, or MPD-I) is applied as an external overlayer. Typically, any additional essentially polymeric resist material used in accordance with this invention is itself essentially non-sublimable under the conditions of electron beam lithography.

The external polymer layers of this invention improve the resolution of the pattern written with an electron beam during the conventional lithographic procedure, and also enhance the sensitivity of the resist (i.e., the contrast in the pattern is much better for the same electron beam exposure when this dried polymer layer is used as an external layer). In other words, the dried polymer overlayer acts like an electron focusing lens element. Because of the increase in resolution and sensitivity, device pattern density can be increased, sometimes by as much as an order of magnitude. Nanometer scale ($10^{-7}$ m or less) lithographic features are possible with this method, and the lithographic features can be placed within 20% of one another. For example, 100 nm wide lines can be placed on 120 nm or less centers. This increase in density is considered to result from a reduction of proximity effects (forward scattering through the resist and backward scattering from the substrate) during electron beam exposure through the polymer layer.

Hexavalent tungsten may be advantageously used together with polymers selected from the group consisting of water-soluble polymers (e.g., PVA, PVP, HPC and PVAc) and MPD-I to provide an external coating layer for improving the resolution of pattern formation using an electron beam. For these embodiments a mixture of hexavalent tungsten compounds and the polymer may be applied by spin-coating. Suitable tungsten compounds include $WCl_6$, $W(OEt)_6$, isopolytungstates and hetero-polytungstates. The tungsten compounds may be mixed with the desired polymer by dissolving both materials in a suitable solvent. Mixtures may be made with water-soluble polymers (e.g., PVP with $WCl_6$) or water-insoluble polymers (e.g., MDP-I with $WCl_6$). Typically, the weight ratio of tungsten compounds to polymer in these embodiments is up to about 1:1. When used, tungsten is typically present in a weight ratio to polymer of at least about 0.01:1.

The tungsten-polymer mixtures may be used in accordance with this invention as the high-resolution resist, or as an overlayer for other dried, essentially polymeric electron resist materials; and this invention provides substrates coated with an electron resist film consisting essentially of these mixtures as well as substrates coated with other polymeric electron resist films having an external coating layer of these mixtures.

Suitable substrates for use in this invention include silicon oxide, silicon, glass, quartz, or glass or quartz coated with a metal such as iron or chromium or with an oxide, nitride or salt of iron or chromium.

Practice of the invention will become further apparent from the following non-limiting examples.

EXAMPLES

For examples 1 through 4, PMMA (4% in chlorobenzene, molecular weight about 496,000) was spin-coated on degreased silicon (100) wafers. The PMMA films were then baked at about 180° C. for from about 30 to 90 minutes. The resulting thickness was from about 200 nm to 250 nm.

EXAMPLE 1

This example exemplifies electron beam over-exposure results (i.e., the layers were not developed). 3% PVA (molecular weight about 86,000) dissolved in 60% dimethyl sulfoxide (DMSO) and 40% chlorobenzene, was spun on top of one of the PMMA films prepared as described above. The solvent mixture was selected so that the PVA would adequately wet the film. The spin-coated film was then baked at about 90° C. for from about 30 to 90 minutes. The average thickness of the PVA film was about 180 nm.

A computer generated pattern was written with the electron beam on a polyvinyl alcohol-covered PMMA layer. This pattern comprised an oval containing 9 unequally spaced parallel lines over 2.9 $\mu m$ (microns) measured from the leading edge of the first line to the trailing edge of the last line. The two closest spaced lines had a pitch of about 150 nm. The width of each line was about 110 nm. The beam voltage was 10 kV, the current was about 30 pA and the exposure time per point was 1 second. The total writing time was 240 seconds. The pattern was well defined by distinct lines in the PVA-PMMA layers.

The procedure was also conducted using 100% DMSO as the solvent for PVA and resulted in a similar well defined pattern.

The same pattern as above was written on an approximately 200 nm thick PMMA overlayer on top of an approximately 200 nm thick PMMA layer described above. The film was baked at about 180° C. for from about 30 to 90 minutes after the second PMMA layer was spun on. All other experimental conditions were the same as in the PVA-covered PMMA experiment described above. The contrast was almost non-existent and the pattern was essentially invisible.

In order to obtain some contrast in the pattern written on the double PMMA layers, the exposure time per point was increased to 5 seconds and the number of exposure points making up the pattern was halved. The beam voltage was 7 kV, and the beam current was 18 pA.

EXAMPLE 2

A pattern similar to that used in Example 1 (but about ½ the linear dimension of Example 1) was written on a tungsten-impregnated MPD-I layer (90% by weight of $WCl_6$ relative to the MPD-I dissolved in N-methylpyrrolidone (nmp), 3% by weight of MPD-I relative to nmp) onto about 200 nm thick baked PMMA film as described above. The final film was baked at about 90° C. for 25 minutes. The tungsten-impregnated MPD-I overlayer was about 300 nm thick. The total exposure time was 121 seconds. The line width was about 100 nm, and the smallest pitch between two parallel lines was smaller than 120 nm. This is also a result from overexposure (i.e., no development).

EXAMPLE 3

A different test pattern comprising polygons, straight lines and dots was written with the electron beam as described above in Example 1 (10 kV beam voltage; 30 pA beam current) on a PMMA film (200 nm to 250 nm) on the clean silicon substrate. A identical test pattern was written on a tungsten-impregnated PVP film on top of a baked PMMA (200 nm to 250 nm) film on clean silicon. The tungsten-impregnated PVP film was spun from nmp containing 3% by weight of PVP relative to nmp, and 100% by weight of $WCl_6$ relative to PVP in nmp. The final film was baked at about 90° C. for 36 minutes. The average total thickness of the PVP with W and the PMMA films was about 320 nm.

The electron beam voltage was 10 kV and the current was about 30 pA. The exposure time was identical, i.e., 1 second per exposure point, 166 seconds for the whole pattern. Both patterns were over-exposure patterns without development of the resist.

For the portion of the pattern on the PMMA film where two parallel lines were closest together (the pitch was about 250 nm), the lines were smeared so that the separation of the two lines was not distinct. The overall contrast of the pattern with the background was also poor.

For the pattern on the PVP with tungsten on top of PMMA layer the corresponding separation of parallel lines was distinct, indicating improved resolution due to the PVP with tungsten overlayer. The line width was about 150 nm and the pitch of the two lines was about 250 nm. The overall contrast of the pattern with the background was also improved, indicating that the resolution of PMMA with overlayer is improved over the bare PMMA layer.

EXAMPLE 4

A PVP layer was spun from a 3% (by weight) PVP in nmp solution onto a previously spun and baked PMMA film about 200 nm in thickness, as described above. The PVP and PMMA layers were baked at about 80° to 100° C. for about 30 minutes. The resulting total film thickness was about 300 nm. The same pattern as Example 1 was written on the PVP-covered PMMA film at various exposure times per pixel: 1 second, 0.75 second, 0.25 second, and 0.1 second. The PVP layer was developed in water for 90 seconds, and the PMMA layer was developed in 1:1 ratio of 4-methyl-2-pentanone to isopropanol for a total of 160 seconds. The developed film was then rinsed in isopropanol. All the patterns were developable, even the ones written with the short exposure times such as 0.25 second and 0.1 second.

This example shows that the water-soluble polymer overlayer in combination with resist can be developed because again we were able to write a dark pattern on the previously unexposed area, indicating that the substrate was clean silicon. This example also shows that the apparent sensitivity of the PMMA resist has been enhanced.

EXAMPLE 5

Polyvinyl pyrrolidone (molecular weight about 360,000) layer was spin-coated onto the clean silicon wafer having no other resist layer. The PVP layer was spun from a 3% (by weight) of PVP in nmp solution. The film was then baked in an 80° to 100° C. oven for about 44 minutes. The average film thickness was about 80 nm. In this experiment with just the PVP layer, we found that the test pattern described in Example 1 looked essentially the same as if the PMMA had been there. We then dipped the PVP film into room temperature deionized water for 45 seconds or longer. The PVP film came off readily. We examined the developed film, and the test pattern remained on the wafer. We repeated the development in water three times and the pattern did not change.

To make sure that we had in fact stripped the PVP film down to the silicon wafer, we wrote the same test pattern on a piece of clean silicon, the pattern appeared dark instead of white on the clean silicon. This dark pattern was essentially the same as we obtained on the previously unexposed areas of the developed film. This dark pattern came off the wafer readily by dipping the wafer in the deionized water for 60 seconds.

These results show that PVP is electron beam active, and provides resolution far better than PMMA when the pattern density is high.

EXAMPLE 6

A PVA-PVAc film was directly spun on a clean Si substrate having no other resist layer. The PVA-PVAc film was made from 3% by weight Du Pont Elvanol ® (about 80% PVA and about 20% polyvinyl acetate) in DMSO. The film was baked at 90° C. for about 60 minutes. The same pattern as in Example 1 was written with the same electron beam characteristics as in Example 1. Again the pattern imaged had similar line width and pitches as the one obtained in Example 1. The pattern was well defined by distinct lines.

This example shows that PVA-PVAc can be used as electron resist with superior resolution to PMMA.

Particular embodiments of the invention are illustrated in the examples. Other embodiments will become apparent to those skilled in the art from a consideration of the specification or practice of the invention disclosed herein. It is understood that modifications and variations may be practiced without departing from the spirit and scope of the novel concepts of this invention. It is further understood that the invention is not confined to the particular formulations and examples herein illustrated, but it embraces such modified forms thereof as come within the scope of the following claims.

What is claimed is:

1. A substrate coated with a dried polymeric electron beam resist film, characterized by:

said electron beam resist film consisting essentially of an external layer of either external coating polymer selected from the group consisting of polyvinyl alcohol, polyvinyl acetate, polyvinyl pyrrolidone, hydroxypropyl cellulose and poly(m-phenylene isophthalamide), or a mixture consisting essentially of (i) said external coating polymer and (ii) at least one hexavalent tungsten compound wherein the weight ratio of component (ii) to component (i) is up to about 1:1; and said external layer being the only polymeric layer of the coated substrate.

2. A substrate coated with a dried polymeric electron beam resist film characterized by having an external coating layer of a mixture consisting essentially of (i) external coating polymer selected from the group consisting of water-soluble polymers and poly(m-phenylene isophthalamide) and (ii) at least one hexavalent tungsten compound; wherein the weight ratio of component (ii) to component (i) is from about 0.01:1 to about 1:1.

3. The coated substrate of claim 2 wherein the external coating polymer is selected from the group consisting of polyvinyl alcohol, polyvinyl acetate, polyvinyl pyrrolidone, hydroxypropyl cellulose and poly-(m-phenylene isophthalamide).

4. An electron beam lithography process comprising the steps of (a) coating a substrate with a polymeric electron beam resist film, (b) forming an electron beam resist pattern by exposing the electron beam resist film to an electron beam, and (c) developing the electron beam resist pattern characterized by:

in step (a), providing an external layer by coating with a solution containing a mixture of (i) external coating polymer selected from the group consisting of water-soluble polymers and poly(m-phenylene isophthalamide), and (ii) one or more hexavalent tungsten compounds, wherein the weight ratio of component (ii) to component (i) is from about 0.1:1 to about 1:1; and drying the coated solution to provide a coated substrate having a dried external layer of said mixture of polymer component and tungsten component.

5. The method of claim 4 wherein said external layer is applied to the substrate as the only polymer-containing layer of said coated substrate and is an electron beam resist film from about 20 to about 600 nm thick.

6. The method of claim 4 wherein said external layer is applied to an electron beam resist consisting essentially of dried polymer and is from about 20 to about 600 nm thick.

7. The method of claim 6 wherein the external layer is applied to an electron beam resist consisting essentially of polymethylmethacrylate.

8. The method of claim 4 wherein the external coating polymer is selected from the group consisting of polyvinyl alcohol, polyvinyl acetate, polyvinyl pyrrolidone, hydroxypropyl cellulose and poly (m-phenylene isophthalamide).

9. The method of claim 8 wherein the external coating polymer is polyvinyl pyrrolidone or poly(m-phenylene isophthalamide); and wherein component (ii) consists essentially of $WCl_6$.

10. An electron beam lithography process comprising the steps of (a) coating a substrate with a polymeric electron beam resist film, (b) forming an electron beam resist pattern by exposing the electron beam resist film to an electron beam, and (c) developing the electron beam resist pattern, characterized by:
in step (a), applying to said substrate an external polymer-containing electron beam resist, by coating the substrate with a solution containing either external coating polymer selected from the group consisting of polyvinyl alcohol, polyvinyl acetate, polyvinyl pyrrolidone, hydroxypropyl cellulose and poly(m-phenylene isophthalamide), or a mixture consisting essentially of (i) said external coating polymer and (ii) at least one hexavalent tungsten compound wherein the weight ratio of component (ii) to component (i) is up to about 1:1; and drying the coated solution to provide a coated substrate having a dried external layer of said external coating polymer or of said mixture of polymer component and tungsten component; said external layer being the only polymeric layer of the coated substrate.

11. The method of claim 10 wherein said external electron beam resist is from about 20 to about 600 nm thick.

12. The method of claim 10 wherein the external electron beam resist consists essentially of said external coating polymer.

13. The method of claim 12 wherein the external coating polymer is selected from the group consisting of polyvinyl alcohol, polyvinyl acetate, polyvinyl pyrrolidone and hydroxypropyl cellulose.

14. The method of claim 12 wherein the external coating polymer is polyvinyl alcohol.

15. The method of claim 10 wherein the external electron beam resist consists essentially of a mixture of said external coating polymer and hexavalent tungsten compounds.

16. The method of claim 15 wherein the external coating polymer is polyvinyl pyrrolidone or poly(m-phenylene isophthalamide); and wherein the tungsten compound is $WCl_6$.

17. An electron beam lithography process comprising the steps of (a) coating a substrate with a polymeric electron beam resist film, (b) forming an electron beam resist pattern by exposing the electron beam resist film to an electron beam, and (c) developing the electron beam resist pattern, characterized by:
in step (a), an external polymer-containing electron beam resist is applied to an electron beam resist consisting essentially of dried polymer on said substrate by coating the electron beam resist consisting essentially of dried polymer with a solution containing external coating polymer selected from the group consisting of polyvinyl alcohol, polyvinyl acetate, polyvinyl pyrrolidone, hydroxypropyl cellulose and poly(m-phenylene isophthalamide), or a mixture consisting essentially of (i) said external coating polymer and (ii) at least one hexavalent tungsten compound wherein the weight ratio of component (ii) to component (i) is up to about 1:1; and drying the coated solution to provide a coated substrate having a dried external layer of said external coating polymer or of said mixture of polymer component and tungsten component.

18. The method of claim 17 wherein said external electron beam resist is from about 20 to about 600 nm thick.

19. The method of claim 18 wherein the external electron beam resist is applied to an electron beam resist consisting essentially of polymethylmethacrylate.

20. The method of claim 17 wherein the external electron beam resist consists essentially of said external coating polymer.

21. The method of claim 20 wherein the external coating polymer is selected from the group consisting of polyvinyl alcohol, polyvinyl acetate, polyvinyl pyrrolidone and hydroxypropyl cellulose.

* * * * *